(12) United States Patent
Karman et al.

(10) Patent No.: US 8,936,373 B2
(45) Date of Patent: Jan. 20, 2015

(54) DIRECTIONAL LIGHT OUTPUT DEVICES SUCH AS MULTI-VIEW DISPLAYS

(75) Inventors: Gerardus Petrus Karman, 'S-Gravenhage (NL); Marc Wilhelmus Gijsbert Ponjee, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 370 days.

(21) Appl. No.: 12/091,592

(22) PCT Filed: Oct. 23, 2006

(86) PCT No.: PCT/IB2006/053887
§ 371 (c)(1),
(2), (4) Date: Apr. 25, 2008

(87) PCT Pub. No.: WO2007/049213
PCT Pub. Date: May 3, 2007

(65) Prior Publication Data
US 2008/0285282 A1    Nov. 20, 2008

(30) Foreign Application Priority Data
Oct. 27, 2005    (EP) .................................... 05110088

(51) Int. Cl.
*F21V 9/16* (2006.01)
*H01L 51/52* (2006.01)
*F21V 8/00* (2006.01)
(Continued)

(52) U.S. Cl.
CPC .......... *H01L 51/5275* (2013.01); *G02B 6/0073* (2013.01); *H01L 51/0096* (2013.01); *H04N 13/0402* (2013.01);
(Continued)

(58) Field of Classification Search
USPC .............. 362/252, 612, 249.02, 231, 84, 613;
313/504; 359/462
See application file for complete search history.

(56) References Cited

U.S. PATENT DOCUMENTS 4,233,767 A    11/1980 Hryhorczuk
5,936,596 A *  8/1999 Yoshida et al. ................... 345/9
(Continued)

FOREIGN PATENT DOCUMENTS

EP    1154676 A1 * 11/2001 ............. H05B 33/12
EP    1450419 A2    8/2004
(Continued)

OTHER PUBLICATIONS

Machine Translation of JP11354275.*
(Continued)

*Primary Examiner* — Evan Dzierzynski
(74) *Attorney, Agent, or Firm* — Larry Liberchuk

(57) ABSTRACT

A light emitting device comprises a substrate (61) and an arrangement of light emitting elements (62) provided over the substrate. The substrate has a contoured surface which defines at least first and second regions (60*a*, 60*b*, 60*c*), having normal directions which face in different directions. The light emitting elements (62) comprise directional light emitting elements, and are provided on the first and second regions (60*b*, 60*c*), thereby to define first and second light emission directions. This arrangement provides light source elements on a structured (topographically non-flat) substrate in a device, such that the angular distribution of light emitted by the device can be electronically adapted by controlling the light emission per light-emitting area.

17 Claims, 5 Drawing Sheets

(51) Int. Cl.
*H01L 51/00* (2006.01)
*H04N 13/04* (2006.01)
*G02F 1/1335* (2006.01)

(52) U.S. Cl.
CPC ............ *G02F 2001/133607* (2013.01); *H01L 2251/5315* (2013.01); *Y02E 10/549* (2013.01)
USPC .................. 362/84; 362/249.01; 359/462

(56) References Cited

U.S. PATENT DOCUMENTS

| | | | |
|---|---|---|---|
| 6,055,013 A * | 4/2000 | Woodgate et al. .............. 348/59 |
| 6,392,341 B2 * | 5/2002 | Jacobsen et al. .............. 313/506 |
| 6,677,610 B2 * | 1/2004 | Choi et al. ...................... 257/59 |
| 6,927,387 B2 * | 8/2005 | Viktorovitch et al. ......... 250/226 |
| 7,190,518 B1 * | 3/2007 | Kleinberger et al. ......... 359/465 |
| 7,439,670 B2 * | 10/2008 | Winters et al. ............... 313/504 |
| 2004/0135160 A1 | 7/2004 | Cok |
| 2004/0263064 A1 * | 12/2004 | Huang .......................... 313/504 |
| 2005/0116624 A1 * | 6/2005 | Shin ............................. 313/504 |
| 2007/0018585 A1 * | 1/2007 | Ijzerman et al. ................ 315/15 |
| 2009/0058845 A1 * | 3/2009 | Fukuda et al. ................. 345/214 |

FOREIGN PATENT DOCUMENTS

| | | | |
|---|---|---|---|
| GB | 2406731 A | 4/2005 | |
| JP | 11354275 A * | 12/1999 | ............. H05B 33/12 |
| JP | 2004226440 A | 8/2004 | |
| WO | WO0017569 A1 | 3/2000 | |
| WO | WO2004036286 A1 | 4/2004 | |

OTHER PUBLICATIONS

Machine Translation of Kazuhide JP 11354235.*
Yang et al: "Pyramid-Shaped Pixels for Full-Color Organic Emissive Displays"; Applied Physics Letters, vol. 77, No. 7, Aug. 14, 2000, pp. 936-938.

* cited by examiner

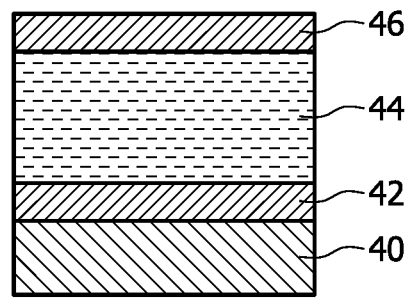
FIG. 4
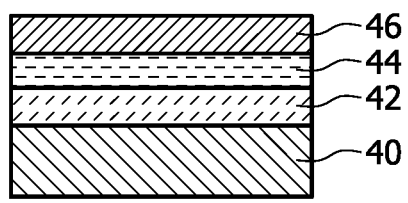 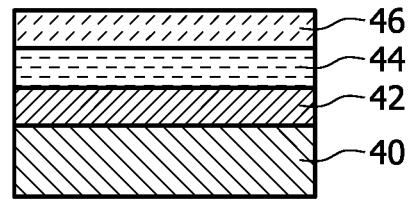
FIG. 5A  FIG. 5B
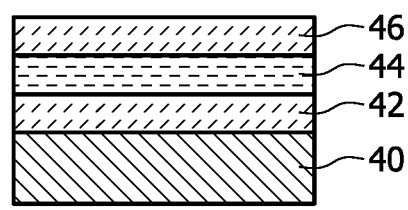
FIG. 5C spotlight diffuse light directional light directional light

DIRECTIONAL LIGHT OUTPUT DEVICES SUCH AS MULTI-VIEW DISPLAYS

This invention relates to directional light output devices, for example multi-view display devices, which are arranged to provide multiple views in different spatial locations.

Multi-view displays are useful for a variety of purposes, such as 3D displays, dual-view car mounted displays, or multi-view presentation displays. 3D displays are increasingly seen as the next major innovation in displays. A common technique to create a 3D image is by combining an existing display such as an LCD or plasma display with an extra optical component that images different pixels into different viewing angles.

FIG. 1 shows schematically this approach, and it can be seen that the light output 10 from columns of pixels is directed to different lateral viewing positions. A user 12 is then able to see different images with the left and right eye, and this is experienced as a 3D or depth effect in the images. Different methods exist to provide the direction of different views to different lateral positions, and the most common approach is to use an array of vertical (or substantially vertical) lenticular lens elements.

For non-stereoscopic displays, a dual view display is another example of multi-view display, and can for example be used for automotive applications. Instead of displaying multiple views to obtain stereoscopic images, different images are displayed in different directions. An example of an application for this technology is a display showing a route planner to the car driver, while allowing the passenger to read e-mail, view movies or play games. For safety reasons, the driver should not be able to see the information presented to the passengers.

In a typical automotive application, the viewing zone intended for the driver and passenger should fulfill requirements explained with reference to FIG. 2. The left graph in FIG. 2 shows the desired light output, which has a central dead zone 20, and two lateral viewing zones 22. For example, the angle α may need to be approximately 14 degrees. The right graph in FIG. 2 shows how the desired emission profile can be realised, as plot 24 compared to the plot 26 for a conventional display. Abrupt changes in transmission are not practical, and a sinusoidal function shape may be appropriate, as shown.

In the direction close to the display normal there should be no visible image (preferably a dark output) and at oblique angles (+/−30 degrees by way of example only) to the left and right, an image should be visible.

A dual view display can be constructed in a number of ways. One known method is to introduce a barrier layer on top of a conventional display (e.g. an LCD), as shown in FIG. 3.

The barrier layer 30 consists of a horizontal array of slits 32 aligned in the vertical direction. The apertures defined by these slits allow light from one display pixel 34 to be visible from viewing angles to the left of the display normal, and light from its neighbouring pixel to be visible only from viewing angles to the opposite side. In this way, two independent images can be displayed: one to the left, and one to the right.

This gives rise to two views 34 and 36 and a dead zone 38 in a direction close to the display normal.

However, as can be seen from FIG. 3, in the dead zone 38 both views are visible, and this presents a region of cross talk, rather than a dark region. An observer sitting in this position will see the image of the first view 34 and the second view 36 merged into one image. This is of course undesirable, and can in automotive applications even be dangerous, since it can distract the driver.

It has been recognised that one way to aim to address this issue is to provide a backlight which only emits light at the oblique angles and not normal to the plane of the backlight.

Backlight design is advancing to provide customizable light sources (for example with selectable brightness, colour and/or light distribution), and these offer flexibility in functional use and design.

An example of technology finding applications in this field is organic solid-state lighting.

For professional applications, efficiency is of prime importance. The developments in solid-state lighting provide two general light source technologies to achieve these goals, namely inorganic light-emitting diodes (LEDs) and organic light emitting diodes (OLEDs). OLEDs are ideal light sources for large area illumination. These light sources can be produced with roll-to-roll processing, and it is expected that affordable light sources will be available on a roll, and which are customizable in shape, colour and size.

OLEDs typically consist of one or more organic layers (based on small molecules and/or polymers), for example in the form of a semiconducting conjugated polymer, sandwiched between electrodes (anode and cathode) on a substrate. One of the electrodes is transparent and the other is a material suitable for injecting holes or electrons into the polymer layer. The term OLED encompasses such polymer materials (PLEDs), or else other types of light emitting diode (LEDs).

FIG. 4 shows the basic structure of an OLED light source, which comprises a substrate 40, a lower electrode layer 42, an electroluminescent layer 44 in the form of an organic stack, and a top electrode 46.

Additional layers, for example to encapsulate the OLED, may also be used. Light generated in the organic stack can leave the device towards the viewer via the substrate (bottom emission OLEDs) or via the top (top emission OLEDs). Bottom emission devices require the use of a transparent substrate 40 and transparent bottom electrode 42, whereas top emission devices require the use of a transparent top electrode 46.

It has been recognised that it is desirable to implement a multi-view (e.g. dual-view) display using an OLED backlight designed in such a way that the light is only emitted under oblique angles and not in the forward direction. However, existing approaches require the use of a barrier.

A barrier is needed in principle because each OLED element emits light in all oblique directions (for example +30 degrees and −30 degrees) whereas only one view per pixel must be emitted.

The low power consumption and dimensional freedom also make OLED light emitting devices a candidate for many general lighting applications. One of the bottlenecks in organic solid-state lighting for general illumination purposes is the non-directed outcoupling of light, causing diffused light. For this reason, it is not efficient to use conventional (i.e. thin, flat) OLEDs for many applications such as local illumination, spot lighting, ceiling lighting, table lighting, automotive interior illumination, desk lighting, task lighting, etc.

Directional light emission by OLEDs can be realised using microcavity optics. The principal effect of an optical cavity on the light emission of an OLED is to redistribute the photon density of states such that only certain wavelengths, which correspond to allowed cavity modes, are emitted in a given direction.

For example, EP 1 154 676 discloses an organic EL device which uses a resonant cavity to improve the colour purity over a range of viewing angles. The optical cavity uses multiple reflections to create resonance.

FIG. 5 shows various basic OLED architectures that comprise an optical cavity.

In FIG. 5a, the lower electrode 42 is semitransparent and top electrode is reflective (bottom emission). In FIG. 5b, the top electrode 46 is semitransparent and bottom electrode is reflective (top emission). In FIG. 5c, both electrodes are semitransparent.

In these architectures, a relatively small distance (of the order of the wavelength to be emitted) is provided between the electrodes, between which light is generated. This dimension controls the allowed cavity modes. The reflecting properties of the electrodes can be obtained by using metals or semitransparent conducting films, optionally in combination with dielectric overcoats.

This form of microcavity cannot be electronically switched to change the direction of the emitted light, and thus does not offer the user the desired control of the angular distribution.

There remains therefore a need to provide control of the angular distribution of light emitted by an OLED-based device.

According to the invention, there is provided a light emitting device, comprising:
a substrate; and
an arrangement of light emitting elements provided over the substrate,
wherein the substrate has a contoured surface which defines at least first and second regions, having normal directions which face in different directions, wherein the light emitting elements comprise directional light emitting elements, and wherein the light emitting elements are provided on the first and second regions, thereby to define first and second light emission directions.

This arrangement provides light source elements on a structured (topographically non-flat) substrate in a device, such that the angular distribution of light emitted by the device can be electronically adapted by controlling the light emission per light-emitting area.

The light emitting elements may for example comprise organic light emitting diode devices (OLEDs). The characteristics of the OLEDs are such that the light emission profile is directional (i.e. non-Lambertian). This can for example be realised by using an OLED comprising a microcavity, or by incorporating additional optical structures in the OLED, or by application of optical elements outside the OLED device, for example prisms or foils.

OLED-based devices can thus be realised in which the angular distribution of emitted light can be electronically adjusted, without the need for mechanically moving parts. Cross talk between different directional outputs can be avoided without the need for barriers.

The directional light emitting elements preferably have a light output which is concentrated around the normal direction to the substrate on which the light emitting element is mounted. For example, the output may have maximum luminance at the normal direction to the substrate on which the light emitting element is mounted, and the full angle at which the luminance is 50% of the maximum can be in the range 5 degrees to 50 degrees, or more preferably 10 degrees to 35 degrees.

The organic light emitting diode devices can comprise an electroluminescent material sandwiched between electrodes, and the electrodes can then define an optical cavity for providing the directional output. This avoids the need for additional elements to define the directional output.

The substrate can have a ridged surface, one surface of each ridge defining a portion of the first region and another surface of each ridge defining a portion of the second region. There may be multiple ridges.

The ridges can comprise triangular projections, which define two non-normal (with respect to the general plane of the substrate) faces, each facing towards a respective side from the normal of the general plane of the substrate.

The first and second regions can each comprise a plurality of portions of the substrate which are each parallel with each other. The portions can together define a combined light output surface.

The device may comprise a backlight for a display device. The regions then each are associated with pixels for one display image to be displayed in a particular direction, or range of directions.

The first and second regions may then each comprise a plurality of continuous portions of the substrate which are each parallel with each other, and each portion is associated with sub pixels of red green or blue colour. Alternatively, each portion can be associated with sub pixels of each of red green and blue colours. When a ridge shape is used to define the portions, the sub pixels of each colour can be aligned with the length of the ridge or can alternate along the length of the ridge. This enables the distance between sub-pixels of the same colour for the same display image to be kept to a minimum, to improve the perceived resolution.

The invention also provides a display device using the backlight of the invention. The display device may be operable in use to use the light emitting elements provided on the first and second regions to display first and second images. This allows the realisation of multi-view (e.g. autostereoscopic) displays without the need for additional optical elements, such as lenticular lenses.

In another implementation, the device comprises a controllable light source. This allows the realisation of OLED-based lighting elements for which the light distribution can be electronically controlled. This adds a degree of freedom to the use of lighting elements.

Examples of the invention will now be described in detail with reference to the accompanying drawings, in which:

FIG. 4 shows in schematic form the structure of a conventional OLED display device;

FIG. 5 shows in schematic form the known structure of an OLED display device using an optical cavity to control light output direction;

FIG. 6 shows a first example of a directional light source of the invention, which can be used as a backlight for a multiview directional display device. This example uses a non-flat substrate to provide different portions of the light source with different normal angles of emission, and the light source elements are themselves directional.

Figure 1:
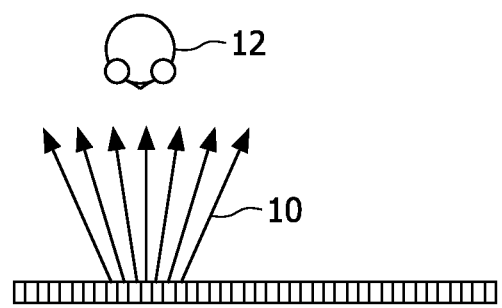
FIG. 1 is used to explain the principle of operation of a multi view display.
Figure 2:
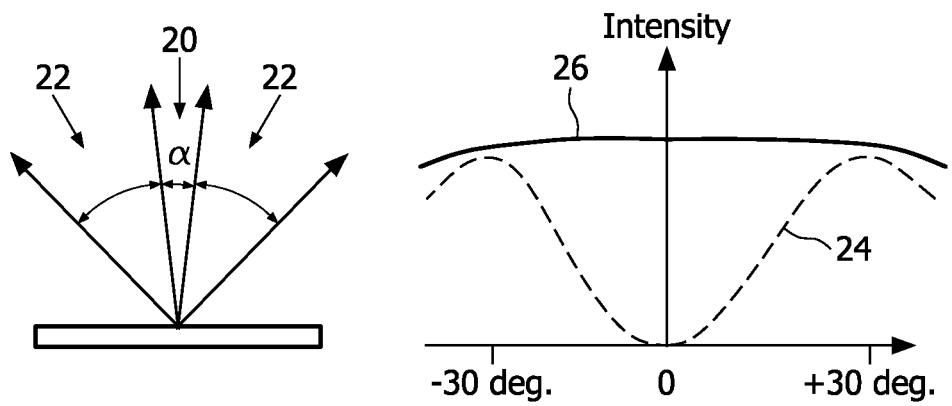
FIG. 2 shows the desired light intensity output for a multi view display for use in an automotive application.
Figure 3:
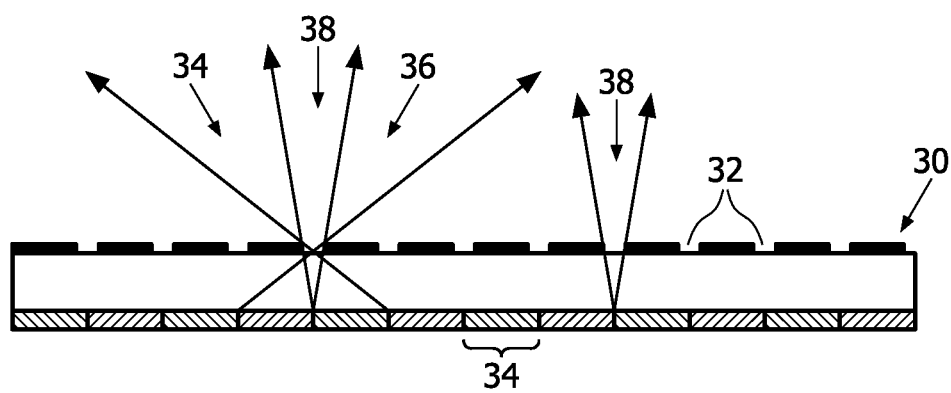
FIG. 3 shows the use of a barrier layer to attempt to obtain the desired directional output explained with reference to FIG. 2.
Figure 6:
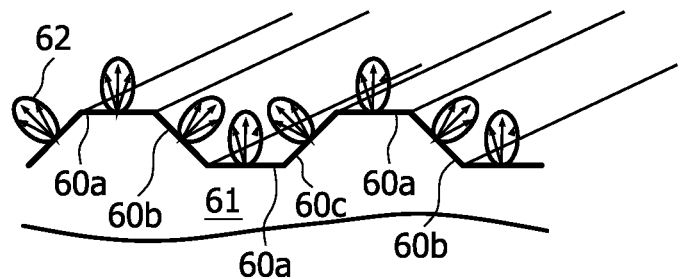
FIG. 6 shows a first light emitting device of the invention.

FIG. 6 shows one possible shape for the substrate, in which a first set of faces 60a face normally outwardly, a second set of faces 60b face to one side and a third set of faces 60c face to the other side.

Directional OLEDs are used on this structured (topographically non-flat) substrate to control the angular distribution of emitted light. The light sources 62 are directional, and therefore have a luminance which is not equal for all angles i.e. a non-Lambertian output. The directional output is represented by ellipses.

The substrate can be rigid, flexible or conformal. A conformal substrate can conform to another substrate/device on which it is laminated. The substrate can thus initially be flexible, but only until it has been shaped into the desired configuration, with the shape then fixed and no longer changed repetitively.

The light sources 62 are arranged as bars, for example running top to bottom with respect to the normal viewing orientation of a display to be illuminated by the light source.

Due to the structuring of the substrate, the OLED bars emit light in different directions. By controlling the luminance per bar, the resulting emission profile of the OLED device can be electronically adjusted. Such structured OLED devices can therefor be applied in multi-view displays or in solid-state lighting devices for general illumination purposes.

Of course, many suitable surface profiles exist. The key aspect of a suitable surface profile is that there is a difference between the directions of the normal for different substrate areas. A surface profile may contain a 1D topographical pattern (e.g. linear structures like bars) or a 2D topographical pattern.

An example of another suitable structure is a triangular-based structure, such as bars or pyramids with various slopes.

Figure 7:
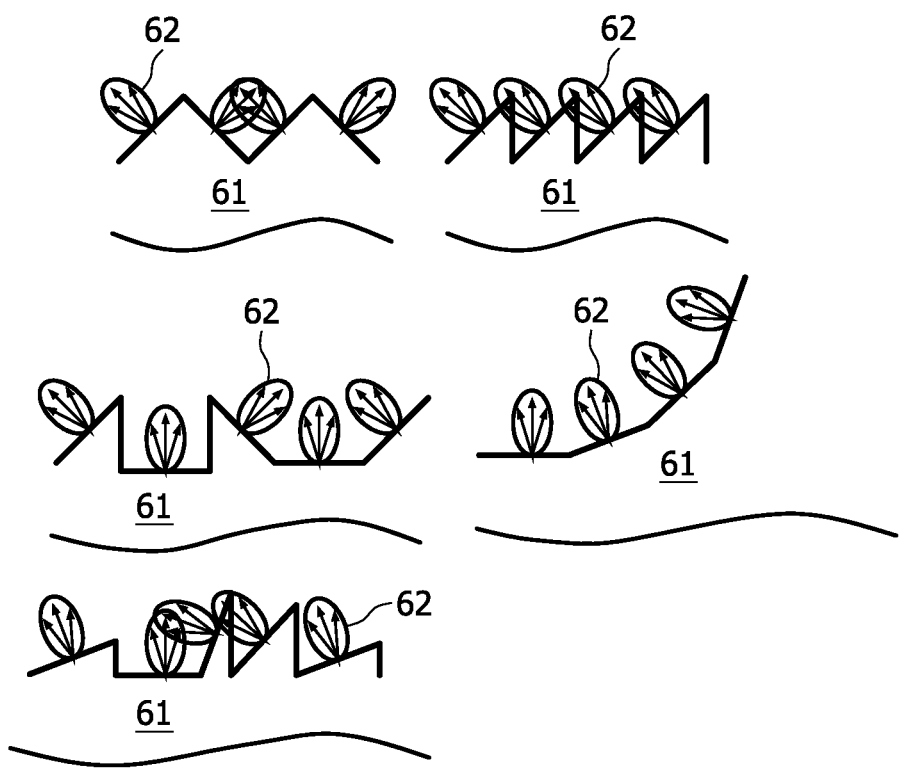
FIG. 7 shows further examples of light emitting device of the invention.

FIG. 7 shows various substrate shapes which can provide a directional output or a range of different directional outputs. Some examples of FIG. 7 use triangular projections to provided two faces, one on each side of the normal to the general plane of the light source.

The OLED elements may be on one or both of these faces, and the triangular projections may be spaced with portions parallel to the general plane of the light source. Again, the directional OLED output is represented by ellipses, and by controlling the luminance per light-emitting bar or area, the emission profile of the OLED device can be electronically adjusted.

A directional OLED can be obtained by using a microcavity in known manner, although other techniques are equally possible, for example using the incorporation of additional optical structures in the OLED, or the application of optical elements such as prisms and foils. However, the directional light output of each OLED element does not require a central dead zone, and the use of barrier layers can thus be avoided.

The substrate may be structured before deposition of the OLED, or after deposition of the OLED. For example, lamination of a directional OLED on a flexible/conformal substrate can be carried out onto a structured carrier.

The patterning features may be on a microscale or larger. In general, the patterning is of the same or larger scale than the OLED display element resolution or the resolution of the underlying display. For example, in the case of a display application, the structuring dimension of the substrate is equal or larger than the (sub)pixel sizes.

At the limit, therefore, the portions which make up the part of the device for one directional output will have a smallest dimension (for example the width of the ridge) which corresponds to the pixel or sub-pixel pitch. Alternatively, each portion may have a smallest dimension which corresponds to the dimension of a sub-set of pixels or subpixels.

FIG. 8 shows an application of the principles outlined above, for implementing a directional backlight for a dual-view display.

FIG. 8 shows bars 80 of directional (i.e. non-Lambertian) OLEDs on a structured (i.e. non-flat) substrate. The substrate is in the form of a series of triangular projections butted together. This structure presents a first set of faces with a first normal direction which is offset from the general normal direction of the plane of the display device, and a second set of faces with a different, second, normal direction which again is offset from the general normal direction of the plane of the display device. This provides a regular triangular oscillating pattern in cross section.

The OLEDs form the backlight for a display device, for example an LCD display.

Figure 8A:
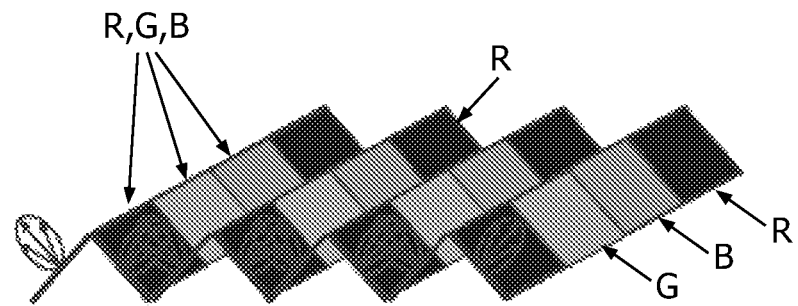
FIG. 8 shows three examples of multi view display device of the invention.

In the example shown in FIG. 8A, each bar 80 of OLED elements is for illuminating red, green and blue (sub) pixels R,G,B of the overlying display, in sequence along the bar. In the example shown in FIG. 8B, each bar of OLED elements is for illuminating three sub-bars of red, green and blue (sub) pixels R,G,B, which define continuous columns. In the example shown in FIG. 8C, each bar of OLED elements is for illuminating only one colour of (sub) pixel.

The different options in FIG. 8 not only represent different designs for the backlight (in particular the ridge size, as this is of sub-pixel size or of pixel triplet size) but also determine the design and control of the overlying display. Thus, the backlight and the display to be illuminated are designed and controlled (i.e. electronically addressed) as a system.

By controlling the pixel outputs per bar the emission in the various views is controlled, so that the image displayed per view can be controlled.

Figure 8B:
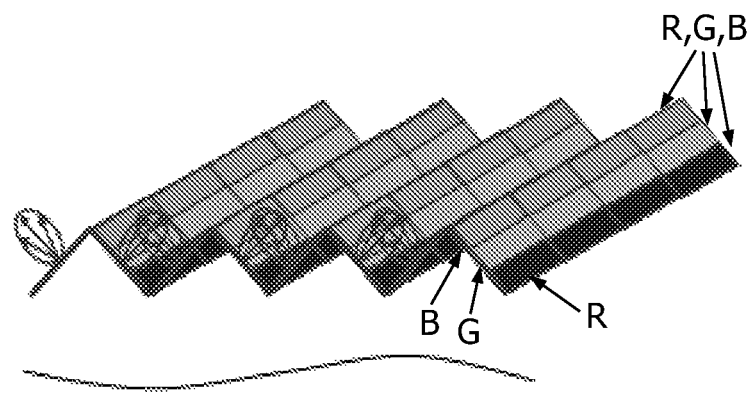
Figure 8C:
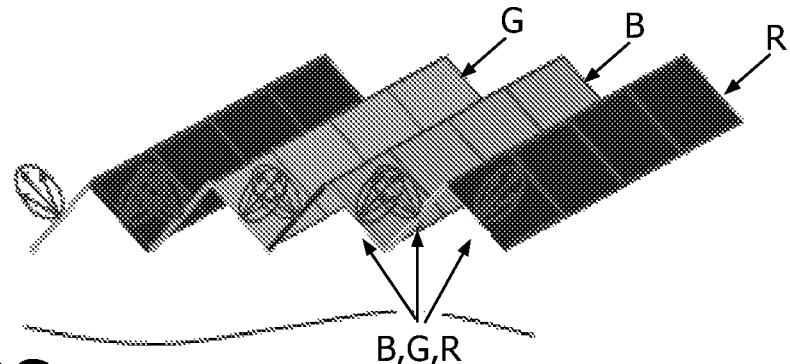

In terms of perceived resolution, the different embodiments shown in FIG. 8 have different performance. In FIG. 8C, the distance between sub-pixels of the same color and with the same surface normal (i.e. the same emission direction) is much larger than in FIGS. 8A and 8B. The result is that the embodiment of FIG. 8C will be perceived as more 'grainy' or having a courser resolution. In general, preferred configurations have combinations of color and/or slope sequences in which the colored sub-pixels (together making up a single pixel) with the same slope are spaced as closely as possible.

This ensures an optimal resolution of the images per view. If non-optimal configurations are used (for instance, if they have advantages in terms of manufacturability) the driving/rendering algorithm for the overlying display can take these effects into account.

In a dual-view (i.e. multi-view) display application, the pattern-scale of the substrate structure is of the same size as the pixels or sub-pixels. Thus, each bar can correspond in dimension to a single sub-pixel width (for the example of FIG. 8A) or a single pixel triplet (for the example of FIG. 8B). It is of course also possible to have a coarser resolution in the substrate shape, so that each bar may be for illuminating a small number of columns of pixels or sub-pixels, although this also deteriorates image quality. The substrate pattern is of course aligned with the pixel-array.

Preferably, the directional OLEDs emit light in a cone that is centered around the normal of the light-emitting area, to avoid multiple views being emitted by a single pixel. The angular width of the cone is preferably 5 degrees to 50 degrees. This width is defined as the full angular width for which the output intensity is 50% or more of the maximum output intensity. This definition measures the emission angle for the main part of the light output and ignores unavoidable low intensity stray light emission at angles far from the normal.

With vertical bars, the substrate structure causes a dual-view in the horizontal direction centered around the normal of the substrate slope. In the vertical direction, the viewing angle is limited by the width of the cone of each light emitting element. To obtain a dual-view display in the horizontal direction with a wider viewing angle in vertical direction, an asymmetric diffuser may be used. The asymmetric diffuser is be positioned in between the light-emitting elements and the viewer.

Of course, many surface profiles exist that may be useful. The following are examples of particularly suitable profiles:

Triangular projections for dual view displays. The slope angles with respect to the general plane of the light source may be in the range 15 to 50 degrees for automotive applications where the display is mounted in the mid console of a car.

Figure 9:
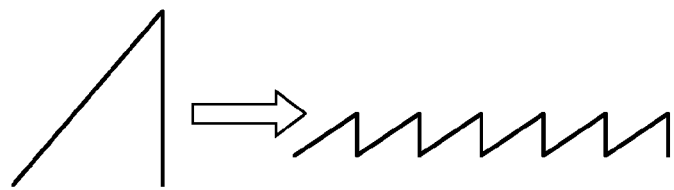
FIG. 9 shows a possible ridge shape for the substrate.

Sawtooth shaped projections. One set of sawtooth projections can be used to replace a larger triangular shape, as shown in FIG. 9.

Figure 10:
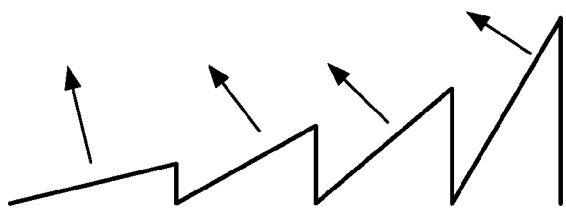
FIG. 10 shows another possible ridge shape for the substrate.

Triangular or sawtooth projections with sets of projections with different slope angles, for multiview or 3D displays, as shown in FIG. 10.

The use of the OLED directional light emitting device to form a backlight for an attenuating display device such as an LCD or in-plane switching electrophoretic display device has been outlined above.

The OLED light emitting elements may instead directly form the pixels of a directional electroluminescent emissive display device. There has been much work on the creation of active matrix display devices on non-flat or flexible substrates.

In this case, the directional light emitting elements can be used to form a directional multi-view display device without the need for an additional display effect. This requires an active matrix array with the non-planar substrate shape, which requires non standard display manufacturing technologies.

However, silicon based active-matrix devices can be formed on flexible substrates, for example there has been considerable research into the use of a flexible polyimide film as a display substrate Such a substrate can be laminated on a more rigid non-flat substrate with surface topography to obtain the desired emission profiles.

There has also been some research into creating active matrix polyLEDs on steel foils, and also the use of rollable active-matrix devices using organic electronics (for example for electrophoretic devices).

The invention can also be applied to light sources in general, for a much wider range of applications.

FIG. 11 shows examples of illumination profiles that can be obtained using a solid-state lighting device according to the invention.

Figure 11A:
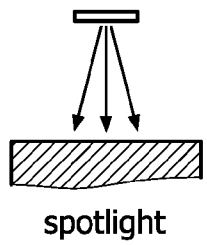
FIG. 11 shows a controllable lighting device of the invention.
Figure 11B:
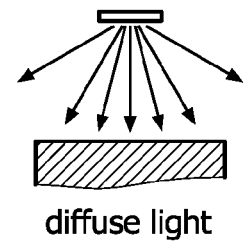
Figure 11C:
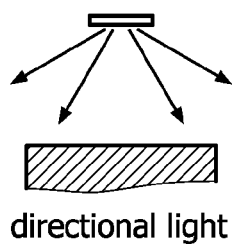
Figure 11D:
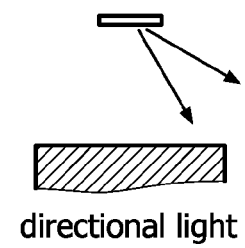

The ability to control the light output of the different light emitting elements directly (rather than controlling attenuation through an overlying display panel) enables a single light source design to be electrically controlled to achieve a number of different lighting effects, such as a spotlight output in the normal direction (FIG. 11A), a diffuse light output (FIG. 11B), a directional output providing primarily peripheral lighting (FIG. 11C) and a directional output providing lighting to a selected side (FIG. 11D).

By adjusting the luminance of the light-emitting area per bar of the structure, the emission profile can be controlled.

The angular distribution can also be combined with directional OLEDs of a specific colour, such that control over the angular distribution can be used to control spatial color distribution.

The widths of the emission cones and/or slope angles that are used can be selected such that there is some overlap between the emitted directions, to prevent the appearance of dark (less illuminated) regions in the illuminated area.

The detailed examples above use substrates that are structured in one dimension (providing bars of substrate area running in parallel). However, two dimensional structures may also be used in organic solid-state lighting devices. For example, an array of pyramids can be used to provide further spatial control of the lighting direction.

In the examples above, the directional light output can be achieved using cavities. However, directional light output can also be achieved using an aperture array overlying the display elements, such that the light output from one light emitting element can pass through one aperture only, and the aperture limits the angular spread of the light output.

For the examples where the device of the invention is used as a backlight or for general illumination purposes, there is no necessity to create individually addressable pixels, for instance using an active matrix. In such cases, bars of directional light emitting elements can be manufactured that are simultaneously addressed. The bars can run parallel (left to right, top to bottom) or in concentric circles or other configurations. This reduces the costs of the electronic backplane, as it only requires a simple patterning of one electrode layer (e.g. the anode or cathode of an OLED).

For examples where the backlight is combined with an LCD, the addressing of the elements in the LCD panel implements the desired control of the light-output, and this also does not require additional complexity for the backlight design.

Figure 12:
FIG. 12 shows a display device of the invention.

FIG. 12 shows a display device of the invention, in which the backlight 120 is in the form of a light emitting device as described above, and a display control device 122 overlies the backlight. This control device can comprise an LCD light modulator, essentially an LCD display without its own backlight.

One example of possible manufacturing technique is to form a planar OLED sheet which is later deformed, for instance by laminating a flexible/conformal OLED sheet on a more rigid pre-formed substrate. Substrates that can be used are plastic (e.g. polyimide) or metal foils.

It is also possible to deposit OLEDs on a pre-shaped substrates, in particular by evaporation. In principle, the functional organic layers that comprise an OLED are extremely thin, for example with a total thickness of the order of 100 nm. Hence, the surface topography needed is limited, and conventional evaporation techniques, and possibly also conventional spin coating techniques, can be applied.

In some applications, the individual light elements do not need independent control. For example for a backlight, the output may be of continuous luminance and from all OLED elements. In other applications, independent control at least of the different directional regions is desirable. When the lighting arrangement directly forms a display, an active matrix array is required to provide independent addressing of each light source, which functions as a pixel, or sub-pixel.

The directional OLEDs can be based on small molecule OLED (smOLED) and polymer OLED (pLED) devices.

Various modifications will be apparent to those skilled in the art.

The invention claimed is:

1. A light emitting device, comprising:
   a substrate; and
   an arrangement of light emitting elements provided over the substrate,
   wherein the substrate has a contoured surface which defines at least first and second regions, having normal directions which face in different directions, wherein the light emitting elements comprise directional light emitting elements, and wherein the light emitting elements are provided on the first and second regions to define first and second light emission directions;
   wherein each of the directional light emitting elements includes a first electrode and a second transparent electrode spaced apart from each other by a distance, the distance defining an optical resonant cavity for providing directional output, with light being generated in the optical resonant cavity and the light leaving the optical resonant cavity through the second transparent electrode.

2. The device as claimed in claim 1, wherein the directional light emitting elements each have a light output which is concentrated around the normal direction to the substrate on which the light emitting element is mounted.

3. The device as claimed in claim 1, wherein the directional light emitting elements have an output which has maximum luminance at or substantially at the normal direction to the substrate on which the light emitting element is mounted, and the full angle at which the luminance is 50% of the maximum is in the range 5 degrees to 50 degrees.

4. The device as claimed in claim 3, wherein the full angle at which the luminance is 50% of the maximum is in the range 10 degrees to 35 degrees.

5. The device as claimed in claim 1, wherein the light emitting elements comprise organic light emitting diode devices.

6. The device as claimed in claim 5, wherein the light emitting elements comprise electroluminescent material located in the optical cavity.

7. The device as claimed in claim 1, wherein the substrate has a ridged surface, one surface of each ridge defining a portion of the first region and another surface of each ridge defining a portion of the second region.

8. The device as claimed in claim 7, wherein the ridges comprise triangular projections.

9. The device as claimed in claim 1, wherein the first and second regions each comprise a plurality of portions of the substrate which are each parallel with each other.

10. The device as claimed in claim 1, comprising a controllable light source of which the angular distribution and/or spatial color distribution can be electronically controlled.

11. A display device, comprising:
    a backlight comprising a light emitting device that includes a substrate and an arrangement of light emitting elements provided over the substrate, wherein the substrate has a contoured surface which defines at least first and second regions, having normal directions which face in different directions, wherein the light emitting elements comprise directional light emitting elements, and wherein the light emitting elements are provided on the first and second regions to define first and second light emission directions; and
    a display control device overlying the backlight;
    wherein each of the directional light emitting elements includes a first electrode and a second transparent electrode spaced apart from each other by a distance, the distance defining an optical resonant cavity for providing directional output, with light being generated in the optical resonant cavity and the light leaving the optical resonant cavity through the second transparent electrode.

12. The device as claimed in claim 11, wherein the first and second regions each comprise a plurality of continuous portions of the substrate which are each parallel with each other, and wherein each portion is associated with sub pixels of red green or blue colour.

13. The device as claimed in claim 11, wherein the first and second regions each comprise a plurality of continuous portions of the substrate which are each parallel with each other, and wherein each portion is associated with sub pixels of each of red green and blue colours.

14. The device as claimed in claim 13, wherein each portion comprises a surface of a ridge, and wherein the sub pixels of each colour are aligned with the length of the ridge.

15. The device as claimed in claim 13, wherein each portion comprises a surface of a ridge, and wherein the sub pixels of each colour alternate along the length of the ridge.

16. The device as claimed in claim 11, wherein the display device is operable to use the light emitting elements provided on the at least first and second regions to display at least first and second images.

17. The device as claimed in claim 16, wherein the display device is operable to use the light emitting elements provided on the first and second regions to display first and second images monocular images to different eyes of a user.

* * * * *